United States Patent
Lin et al.

(10) Patent No.: US 10,490,133 B2
(45) Date of Patent: Nov. 26, 2019

(54) SHIFT REGISTER MODULE AND DISPLAY DRIVING CIRCUIT THEREOF

(71) Applicant: HON HAI PRECISION INDUSTRY CO., LTD., New Taipei (TW)

(72) Inventors: Chien-Wen Lin, New Taipei (TW);
Yu-Fu Weng, New Taipei (TW);
Chia-Lin Liu, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 20 days.

(21) Appl. No.: 15/674,523

(22) Filed: Aug. 11, 2017

(65) Prior Publication Data

US 2018/0053471 A1 Feb. 22, 2018

Related U.S. Application Data

(60) Provisional application No. 62/376,541, filed on Aug. 18, 2016.

(51) Int. Cl.
*G11C 19/00* (2006.01)
*G09G 3/3266* (2016.01)
*G09G 3/3225* (2016.01)
*G11C 19/28* (2006.01)
*G09G 3/36* (2006.01)

(52) U.S. Cl.
CPC ......... *G09G 3/3266* (2013.01); *G09G 3/3225* (2013.01); *G11C 19/28* (2013.01); *G09G 3/3677* (2013.01); *G09G 2300/0408* (2013.01); *G09G 2300/0426* (2013.01); *G09G 2300/0852* (2013.01); *G09G 2310/0286* (2013.01); *G09G 2310/08* (2013.01); *G09G 2330/021* (2013.01)

(58) Field of Classification Search
None
See application file for complete search history.

(56) References Cited

U.S. PATENT DOCUMENTS

| 7,929,658 | B2 | 4/2011 | Lin et al. | |
|---|---|---|---|---|
| 9,489,878 | B2 | 11/2016 | Pai et al. | |
| 2011/0157124 | A1* | 6/2011 | Jung | G11C 19/28 345/211 |
| 2011/0222645 | A1* | 9/2011 | Tobita | G09G 3/3677 377/78 |
| 2011/0228893 | A1* | 9/2011 | Tobita | G11C 19/184 377/77 |

(Continued)

FOREIGN PATENT DOCUMENTS

| TW | 201103260 A1 | 1/2011 |
|---|---|---|
| TW | 201525974 A | 7/2015 |

*Primary Examiner* — Tuan T Lam
(74) *Attorney, Agent, or Firm* — ScienBiziP, P.C.

(57) ABSTRACT

A display driving circuit for driving pixel units comprises a time controller, a first driving circuit, and a second driving circuit. The first driving circuit comprises a plurality of shift registers, and supplies phase-shifted scan signals. The shift registers are connected in cascade. Each shift register receives two clock signals from the time controller. Each shift register is a bidirectional shift register. Each shift register includes a pull-up transistor, a pull-down transistor, and a pull-down unit. The pull-down unit controls the pull-down transistor to turn on after the shift register being reset to prevent the shift register outputting an error signal.

10 Claims, 7 Drawing Sheets

(56) References Cited

U.S. PATENT DOCUMENTS

| | | | |
|---|---|---|---|
| 2013/0169609 A1* | 7/2013 | Son | G11C 19/28 345/209 |
| 2014/0049712 A1* | 2/2014 | Yu | G02F 1/13306 349/34 |
| 2014/0168049 A1* | 6/2014 | Gu | G09G 3/3685 345/100 |
| 2014/0168050 A1* | 6/2014 | Gu | G09G 3/3611 345/100 |
| 2015/0332784 A1* | 11/2015 | Yan | G09G 3/3611 377/64 |
| 2016/0012764 A1* | 1/2016 | Xu | G11C 19/28 345/204 |
| 2016/0027526 A1* | 1/2016 | Xu | G11C 19/28 345/215 |
| 2016/0253975 A1* | 9/2016 | Yang | G11C 19/28 345/58 |
| 2016/0275902 A1* | 9/2016 | Xue | G09G 5/003 |
| 2016/0351156 A1* | 12/2016 | Wu | G11C 19/28 |
| 2016/0365054 A1* | 12/2016 | Wu | G11C 19/28 |

* cited by examiner

SHIFT REGISTER MODULE AND DISPLAY DRIVING CIRCUIT THEREOF

CROSS-REFERENCE TO RELATED APPLICATIONS

This application claims priority to U.S. Provisional Application No. 62/376,541 filed on Aug. 18, 2016, the contents of which are incorporated by reference herein.

FIELD

The present disclosure relates to a shift register module and a display driving circuit thereof.

BACKGROUND

In recent years, display devices, such as liquid crystal display devices and organic electroluminescent (EL) display devices are becoming widespread. These display devices includes a display panel and a driving circuit for driving the display panel to display images. The driving circuit includes a gate driving circuit for providing gate driving pulse signals to control the display panel, and a source driving circuit for providing data signals to the display panel. In the gate driving circuit, shift register circuits are generally provided for signal shifting and registering. The gate driving circuit can be for example an individual chip or a GOA (gate on array) type circuit. The gate-on-array (GOA) type gate driving circuit is different from a chip type gate driving circuit and is capable of being directly integrated in a substrate of the display panel because the GOA driving circuit is formed by a plurality of transistors. In such GOA type gate driving circuit, multiple cascaded shift registers are included and are controlled by multi-phase clock signals. The cascaded shift registers only can provide signals to the scan lines in one specified order, such as in a forward order from the first scan line to the last scan line. Improvement in the art is preferred.

BRIEF DESCRIPTION OF THE FIGURES

Implementations of the present disclosure will now be described, by way of example only, with reference to the attached figures, wherein.

DETAILED DESCRIPTION

Figure 1:
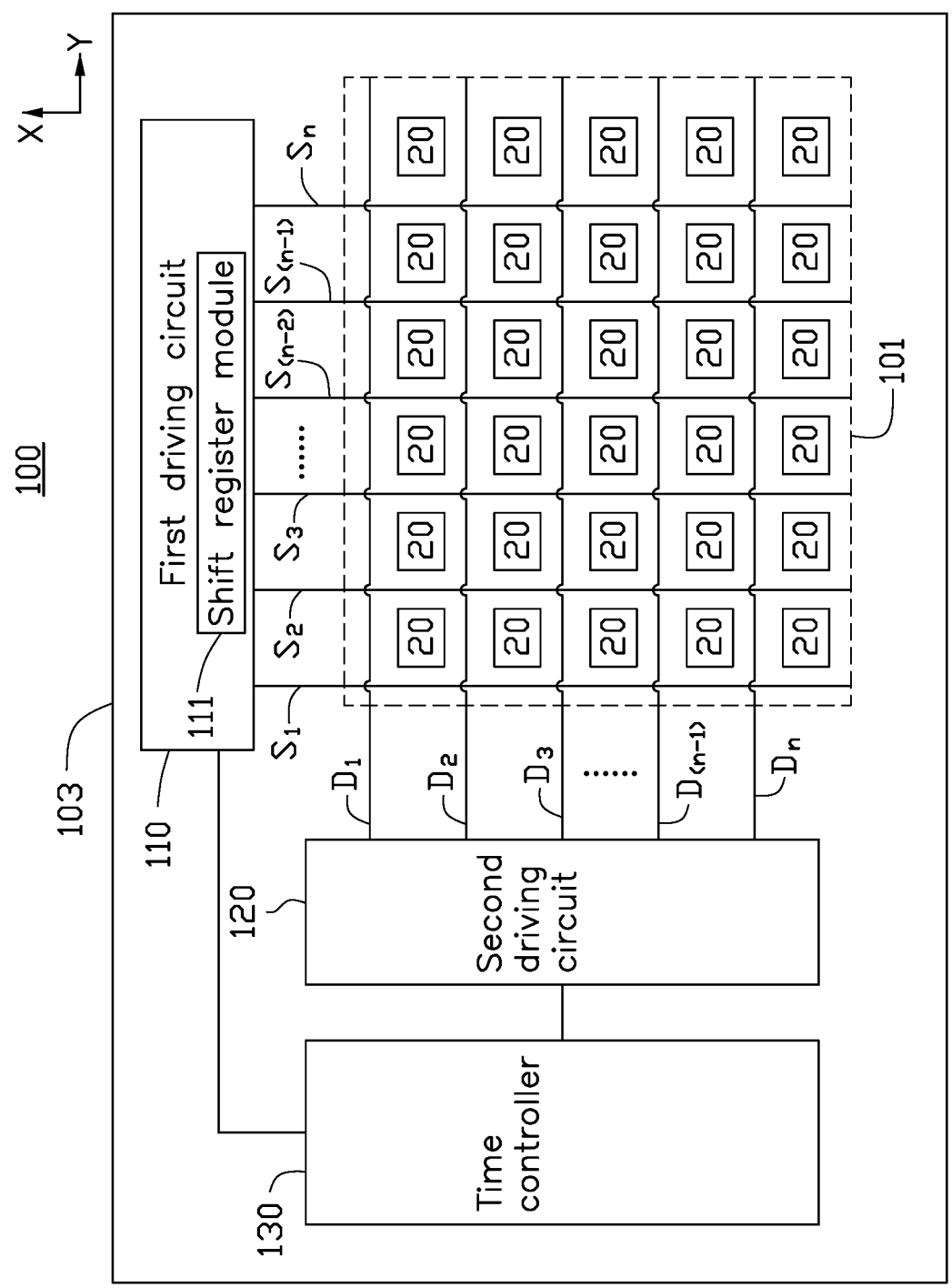
FIG. 1 is a plan view of an exemplary embodiment of a display driving circuit, the display driving circuit comprises a gate driving circuit with a shift register.

It will be appreciated that for simplicity and clarity of illustration, where appropriate, reference numerals have been repeated among the different figures to indicate corresponding or analogous elements. In addition, numerous specific details are set forth in order to provide a thorough understanding of the exemplary embodiments described herein. However, it will be understood by those of ordinary skill in the art that the exemplary embodiments described herein can be practiced without these specific details. In other instances, methods, procedures, and components have not been described in detail so as not to obscure the related relevant feature being described. The drawings are not necessarily to scale and the proportions of certain parts may be exaggerated to better illustrate details and features. The description is not to be considered as limiting the scope of the exemplary embodiments described herein.

Several definitions that apply throughout this disclosure will now be presented.

The term "comprising" means "including, but not necessarily limited to"; it specifically indicates open-ended inclusion or membership in a so-described combination, group, series, and the like.

The present disclosure is described in relation to a display device with a narrow border effect.

FIG. 1 illustrates an exemplary embodiment of a display driving circuit 100 for driving a display apparatus. In at least one exemplary embodiment, the display apparatus is, for example, an organic light emitting diode (OLED) device. The display driving circuit 100 is located in a non-display region 103 of the display apparatus, and includes a first driving circuit 110, a second driving circuit 120, and a time controller 130. The first driving circuit 110 is electrically connected to a plurality of scan lines $S_1$-$S_n$ located in a display region 101 surrounded by the non-display region 103. The second driving circuit 120 is electrically connected to a plurality of data lines $D_1$-$D_m$ located in the display region 101. The scan lines $S_1$-$S_n$ extending along a first direction X and the data lines $D_1$-$D_m$ extending along a second direction Y perpendicular to the first direction X in a grid formation define a plurality of pixel units 20. The scan lines $S_1$-$S_n$ are insulated from the data lines $D_1$-$D_m$. The scan lines $S_1$-$S_n$ and the data lines $D_1$-$D_m$ are extended into the non-display region 103 for connecting with the first driving circuit 110 and the second driving circuit 120 respectively. The time controller 130 supplies various control signals to the first driving circuit 110 and the second driving circuit 120 for driving the display apparatus to display images, and further supplies data signals to the second driving circuit 120. The various control signals may includes a vertical synchronization (Vsync) signal, a horizontal synchronization (Hsync) signal, a clock (CLK) signal, and a data enable (DE) signal, but is not limited thereto. The first driving circuit 110 sequentially supplies scan signals to the scan lines $S_1$-$S_n$ for scanning the pixel units 20 during one frame time. The second driving circuit 110 allots the data signals to the data line $D_1$-$D_m$ for displaying an image during one frame time. In at least one exemplary embodiment, the first driving circuit 110 is located upon the display region 101, and the second driving circuit 120 is located on a left side of the display region 101. In at least one exemplary embodiment, the first driving circuit 110 is a gate driving circuit, and the second driving circuit 120 is a source driving circuit.

Figure 2:
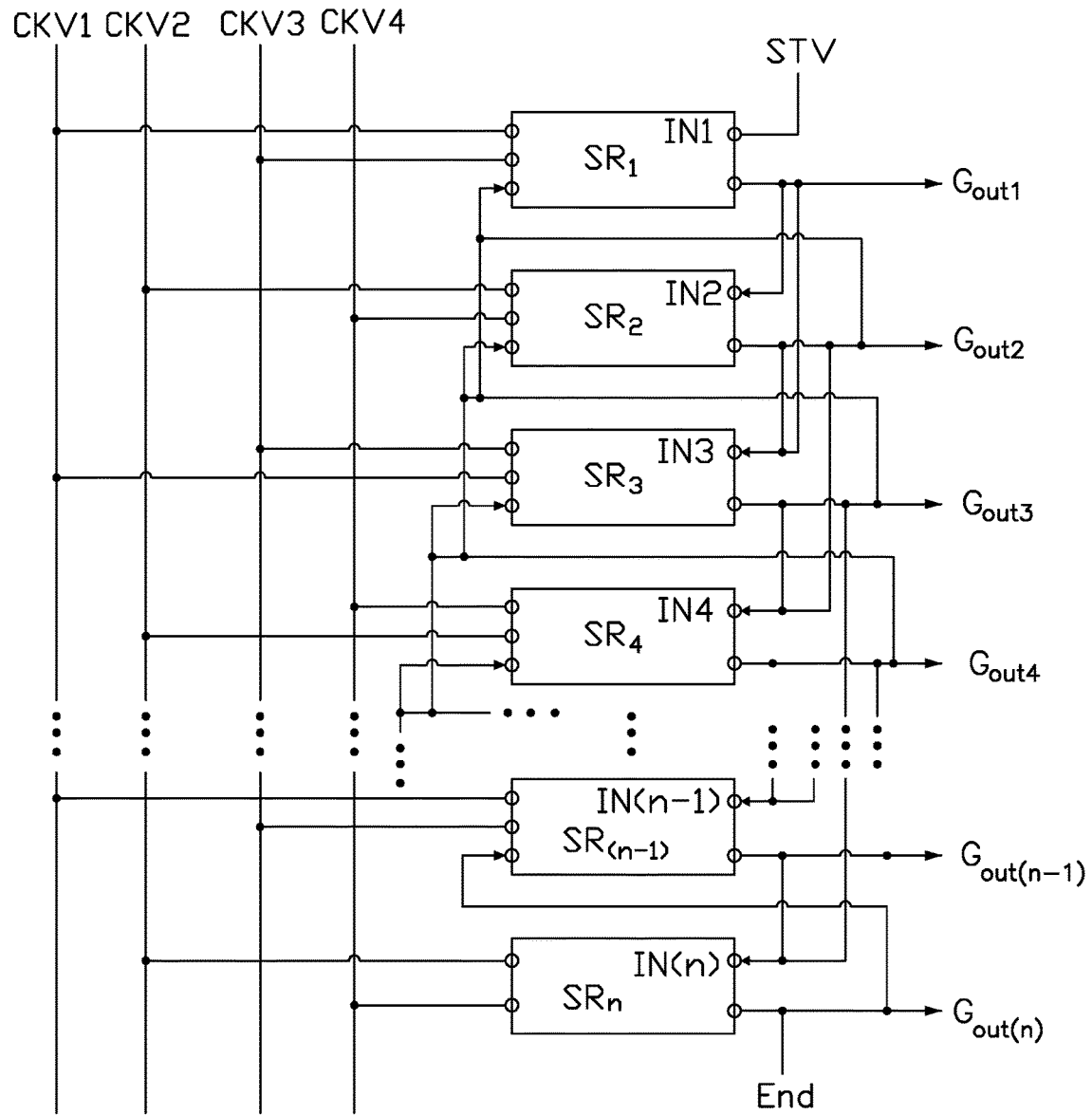
FIG. 2 is a circuit diagram of a first exemplary embodiment of the shift register of FIG. 1.

FIG. 2 illustrates a first exemplary embodiment of the first driving circuit 110. The first driving circuit 110 includes a shift register module 111 as shown in FIG. 1. Referring to FIG. 2, the shift register module 111 includes plurality of shift registers $SR_1$-$SR_n$ corresponding to the scan lines $S_1$-$S_n$ respectively. The shift registers $SR_1$-$SR_n$ are electrically connected in cascade. Each shift register $SR_1$-$SR_n$ includes an output terminal Gout. The output terminals $G_{out1}$-$G_{outn}$ are respectively connected to the scan lines $S_1$-$S_n$ for providing the scan signal. Each shift register circuit $SR_1$-$SR_n$ receives two clock signals from the time controller 130. In at least one exemplary embodiment, the time controller 130 provides four clock signals CKV1-CKV4 to the first driving circuit 110. Each even numbered shift register $SR_2$, $SR_4$, ... $SR_n$ receives the first clock signals CKV1 and CKV3, and each odd numbered shift register unit $SR_1$, $SR_3$, ... $SR_{(n-1)}$ receives the clock signals CKV2 and CKV4.

Each shift register $SR_1$-$SR_n$ is a bidirectional shift register. The shift registers $SR_1$-$SR_n$ can operate in a forward scanning manner for scanning the scan lines $S_1$-$S_n$, such as in an ascending order, and also can operate in a reverse scanning manner for scanning the scan lines $S_1$-$S_n$, such as in a descending order. The output signal of the (N−2)th shift register $SR_{(n-2)}$ is provided to two following stage shift registers, $SR_{n-1}$ and $SR_n$, and receives the output signals of the two previous stage shift registers, $SR_{(n-3)}$ and $SR_{(n-4)}$, where n is an integer not less than 5. The first shift register $SR_1$ receives a start signal STV during each head of one frame time.

The shift registers $SR_1$-$SR_n$ have the same structure. Each shift register $SR_1$-$SR_n$ is formed as a 9T-2C type driving circuit as shown in FIG. 3, including a pull-up transistor M1, a pull-down transistor M2, a first transistor M3, a second transistor M4, a third transistor M5, a fourth transistor M6, a fifth transistor M7, a sixth transistor M8, a seventh transistor M9, a first node N1, a second node N2, a first capacitor C1, and a second capacitor C2.

Figure 3:
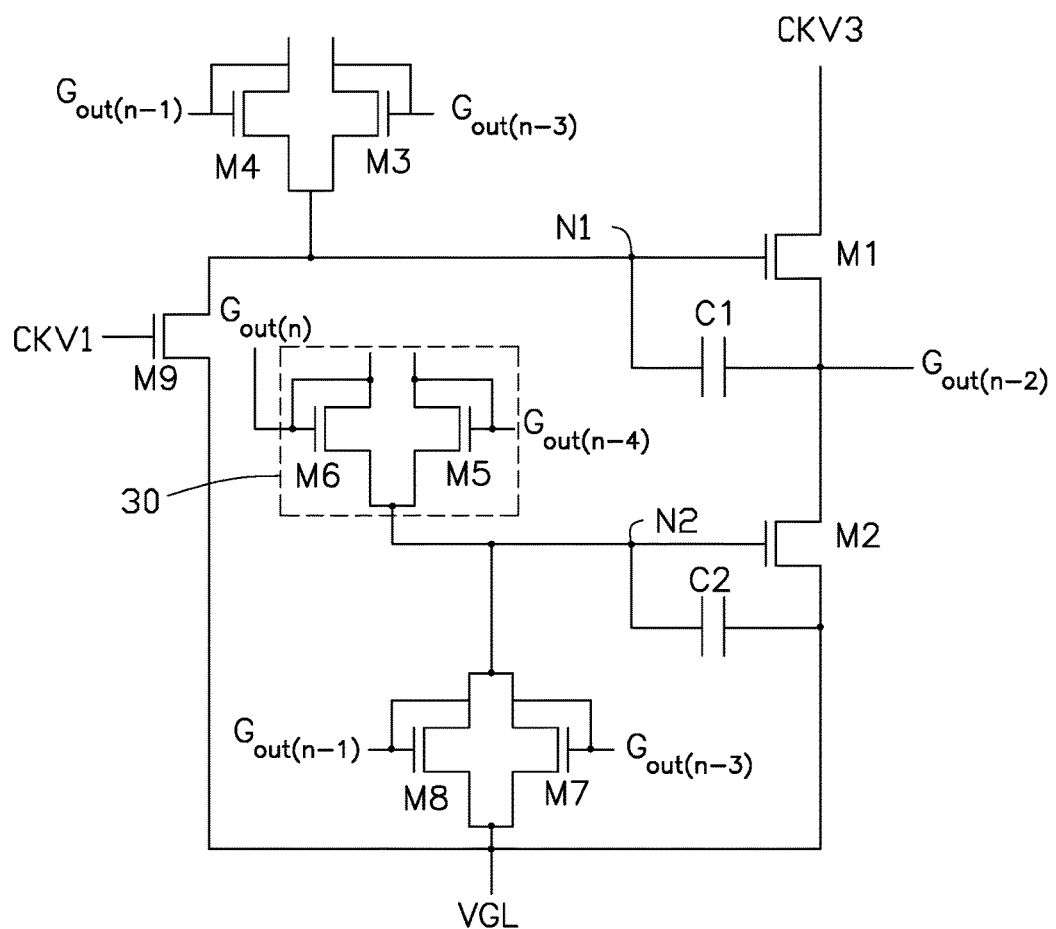
FIG. 3 is a circuit diagram of the (N−2)th shift register of FIG. 2.

FIG. 3 illustrates the (N−2)th shift register $SR_{(n-2)}$. The third clock signal CKV3 is applied to a source electrode of the pull-up transistor M1, and the first clock signal CKV1 is applied to a gate electrode of the seventh transistor M9. A supply voltage VGL is applied to drain electrodes of the pull-down transistor M2, the fifth transistor M7, the sixth transistor M8, and the seventh transistor M9. The output terminal $G_{out(n-2)}$ is electrically connected between a drain electrode of the pull-up transistor M1 and a source electrode of the pull-down transistor M2. Drain electrodes of the first transistor M3 and the second transistor M4 are connected to each other and further connected to a gate electrode of the pull-up transistor M1 through the first node N1. The output terminal $G_{out(n-3)}$ is electrically connected to gate electrodes of the first transistor M3 and the fifth transistor M7. The output terminal $G_{(n-4)}$ is electrically connected to a gate electrode of the third transistor M5. A source electrode of the third transistor M5 is connected to the gate electrode of the third transistor M5. A drain electrode of the third transistor M5 is electrically connected to a gate electrode of the pull-down transistor M2. The output terminal $G_{out(n-1)}$ is electrically connected to gate electrodes of the second transistor M4 and the sixth transistor M8. The output terminal $G_{out(n)}$ is electrically connected to a gate electrode of the fourth transistor M6. A source electrode of the fourth transistor M6 is electrically connected to the gate electrode of the fourth transistor M6. A drain electrode of the fourth transistor M6 is electrically connected to the gate electrode of the pull-down transistor M2. The first capacitor C1 is connected between the gate and drain electrodes of the pull-up transistor M1. The second capacitor C2 is connected between the gate and drain electrodes of the pull-down transistor M2. The second node N2 is electrically connected between the gate electrode of the pull-down transistor M2 and the second capacitor C2. In at least one exemplary embodiment, the pull-up transistor M1, the pull-down transistor M2, the first transistor M3, the second transistor M4, the third transistor M5, the fourth transistor M6, the fifth transistor M7, the sixth transistor M8, and the seventh transistor M9 are N-type Metal Oxide Semiconductor (NMOS) transistors.

The first transistor M3 is used for controlling the pre-charging of the first capacitor C1 in the reverse scanning manner, and the second transistor M4 is used for controlling the pre-charging of the first capacitor C1 in the forward scanning manner.

The third transistor M5 and the fourth transistor M6 form a pull-down module 30. The pull-down module 30 controls the pull-down transistor M2 to be turned on after the (N−2)th shift register $SR_{(n-2)}$ being reset, and prevents the output terminal $G_{out(n-2)}$ of the (N−2)th shift register $SR_{(n-2)}$ from outputting an error signal. The third transistor M5 is used for turning on the pull-down transistor M2 after the (N−2)th shift register $SR_{(n-2)}$ being reset in the reverse scanning manner. The fourth transistor M6 is used for turning on the pull-down transistor M2 after the (N−2)th shift register $SR_{(n-2)}$ being reset in the forward scanning manner.

The fifth transistor M7 controls the discharging of the second capacitor C2 to reset the (N−2)th shift register $SR_{(n-2)}$ in the reverse scanning manner. The sixth transistor M8 controls the discharging of the second capacitor C2 to reset the (N−2)th shift register $SR_{(n-2)}$ in the forward scanning manner.

Figure 4:
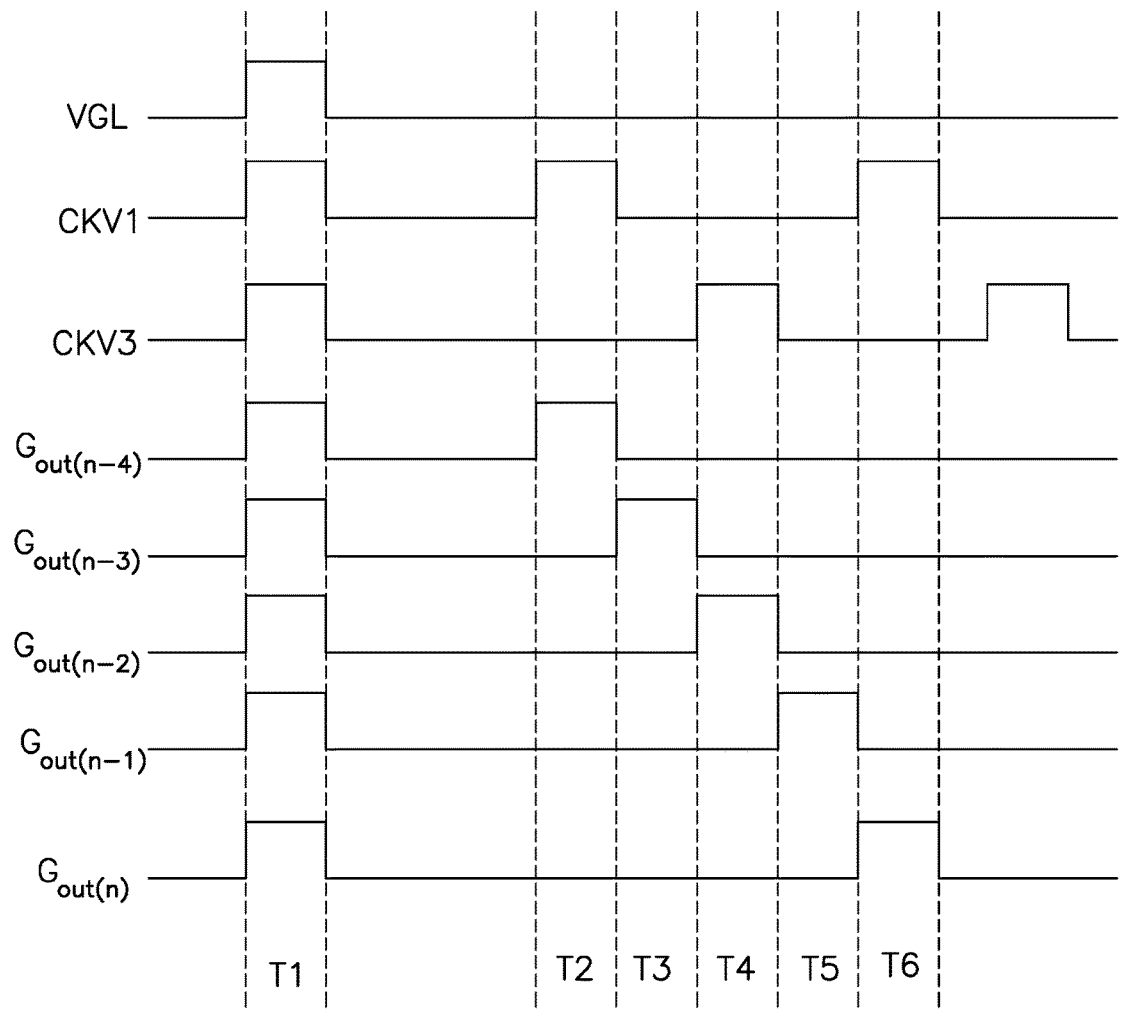
FIG. 4 is a timing chart showing waveforms of various signals inputted to and outputted from the shift register of FIG. 2.

FIG. 4 illustrates operations of a set of shift registers formed by four following shift registers in a forward scanning manner during one frame time. In one frame time, the (N−2)th shift register $SR_{(n-2)}$ sequentially operates under a first period T1, a second period T2 (a first pre-charging period), a third period T3 (a second pre-charging period), a fourth period T4, a fifth period T5 (a reset period), and a sixth period T6. Operation of the (N−2)th shift register unit $SR_{(n-2)}$ is as follows. The signal of the first clock signal CKV1 and the third clock signal CKV3 are simultaneously in a high level voltage during the first period, and phase-shifted in other periods.

During a first period T1 (an initial period), the supply voltage VGL, the first clock signal CKV1, and the third clock signal CKV3 are in a high level voltage, and the shift register $SR_{(n-2)}$ is in an initial state.

During a second period T2, the supply voltage VGL is in a low level voltage, the first clock signal CKV1 is in a high voltage level, the third clock signal CKV3 is in a low level voltage. The (N−4)th driving signal from the (n-4)th output terminal $G_{out(n-4)}$ is in a high level voltage, the (N−3)th driving signal from the (n-3)th output terminal $G_{out(n-3)}$ is in a low level voltage, and the (N−1)th driving signal from the (N−1)th output terminal $G_{out(n-1)}$ is in a low level voltage. The Nth driving signal from the Nth output terminal $G_{out(n)}$ is in a low level voltage. The third transistor M5 turns on, thus the pull-down transistor M2 turns on. The seventh transistor M9 turns on, thus the pull-up transistor M1 turns off. The first transistor M3, the second transistor M4, the fourth transistor M6, the fifth transistor M7, and the sixth transistor M8 turn off.

During a third period T3, the supply voltage VGL is in a low level voltage, the first clock signal CKV1 is in a low voltage level, and the third clock signal CKV3 is in a low level voltage. The (N−4)th driving signal from the (N−4)th output terminal $G_{out(n-4)}$ is in a low level voltage, the (N−3)th driving signal from the (N−3)th output terminal $G_{out(n-3)}$ is in a high level voltage, and the (N−1)th driving signal from the (N−1)th output terminal $G_{out(n-1)}$ is in a low level voltage. The Nth driving signal from the Nth output terminal $G_{out(n)}$ is in a low level voltage. The first transistor M3, thus the first capacitor C1 is charged. The pull-up transistor M1 turns on, and the output terminal $G_{out(n-2)}$ outputs a low level signal based on the third clock signal CKV3. The fifth transistor M7 turns on thus the pull-down transistor M2 turns off. The second transistor M4, third transistor M5, the fourth transistor M6, the sixth transistor M8, and the seventh transistor M9 turn off.

During a fourth period T4, the supply voltage VGL is in a low level voltage, the first clock signal CKV1 is in a low voltage level, and the third clock signal CKV3 is in a high level voltage. The (N−4)th driving signal from the (N−4)th output terminal $G_{out(n-4)}$ is in a low level voltage, the (N−3)th driving signal from the (N−3)th output terminal $G_{out(n-3)}$ is in a low level voltage, and the signal outputted by the (N−1)th output terminal $G_{out(n-1)}$ is in a low level voltage. The Nth driving signal from the Nth output terminal $G_{out(n)}$ is in a low level voltage. The pull-up transistor M1 turns on based on a potential stored by the first capacitor C1, and the output terminal $G_{out(n-2)}$ switches to a high level signal based on the third clock signal CKV3, thus the shift register $SR_{(n-2)}$ outputs the scan signal. The first transistor M3, the second transistor M4, the third transistor M5, the fourth transistor M6, the fifth transistor M7, the sixth transistor M 8, and the seventh transistor M9 turn off.

During a fifth period T5 (reset period), the supply voltage VGL is in a low level voltage, the first clock signal CKV1 is in a low voltage level, and the third clock signal CKV3 is in a low level voltage. The (N−4)th driving signal from the (N−4)th output terminal $G_{out(n-4)}$ is in a low level voltage, the (N−3)th driving signal from the (N−3)th output terminal $G_{out(n-3)}$ is in a low level voltage, the (N−1)th driving signal from the (N−1)th output terminal $G_{out(n-1)}$ is in a high level voltage, and the Nth driving signal from the Nth output terminal $G_{out(n)}$ is in a low level voltage. The first transistor M3, the third transistor M5, the fourth transistor M6, the fifth transistor M7, and the seventh transistor M9 turn off, the second transistor M4 and sixth transistor M8 turn on, thus the pull-up transistor M1 turns on, and the pull-down transistor M2 turns off, causing the output terminal $G_{out(n-2)}$ is in a low level signal based on the third clock signal CKV3, the shift register $SR_{(n-2)}$ is reset.

During a sixth period T6, the supply voltage VGL is in a low level voltage, the first clock signal CKV1 is in a high voltage level, and the third clock signal CKV3 is in a low level voltage. The (N−4)th driving signal from the (N−4)th output terminal $G_{out(n-4)}$ is in a low level voltage, the (N−3)th driving signal from the (N−3)th output terminal $G_{out(n-3)}$ is in a low level voltage, and the signal outputted by the (N−1)th output terminal $G_{out(n-1)}$ is in a low level voltage. The Nth driving signal from the Nth output terminal $G_{out(n)}$ is in a high level voltage. The pull-up transistor M1, the first transistor M3, the second transistor M4, the third transistor M5, the fifth transistor M7, the sixth transistor M8, and the seventh transistor M9 turn off. The fourth transistor M6 turns on, thus the pull-down transistor M2 turns on to prevent the output terminal $G_{out(n-2)}$ from outputting an error signal.

The structure of the first driving circuit 110 allows the first driving circuit 110 to scan the scan lines $S_1$-$S_n$ in a forward manner and the scan lines $S_1$-$S_n$ to be scanned in a reverse manner. The first driving circuit is driven by four clock signals during one frame time, thus the power consumption of the display driving circuit is reduced. The pull-down module prevents the shift register from outputting error signals during the reset period, thus a performance of the shift register is improved.

Figure 5:
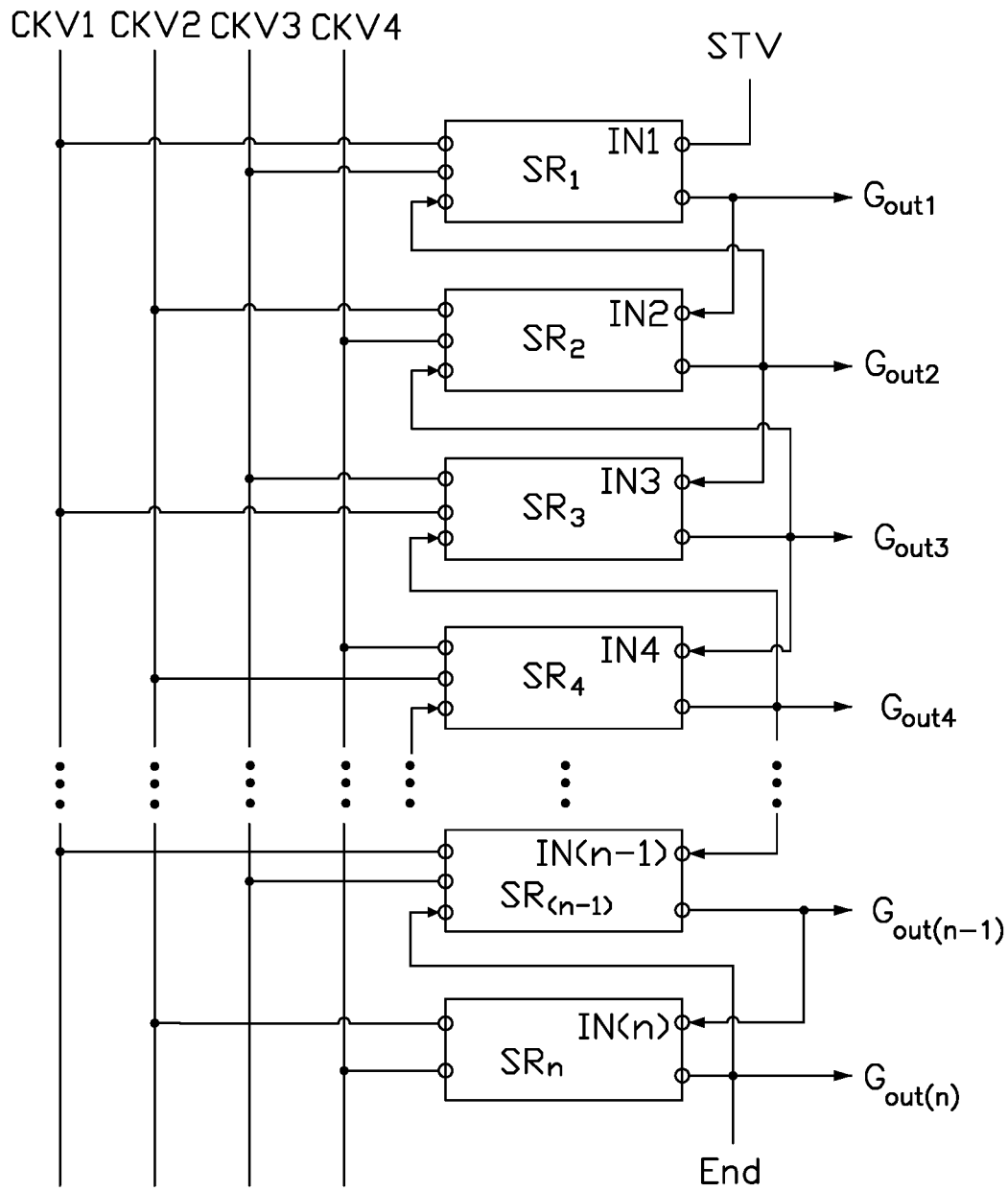
FIG. 5 is a circuit diagram of a second exemplary embodiment of the gate driving circuit of FIG. 1.

FIG. 5 illustrates a second exemplary embodiment of the shift register module 211. The shift register module 111 includes a plurality of shift registers $SR_1$-$SR_n$ corresponding to the scan lines $S_1$-$S_n$ respectively. The shift registers $SR_1$-$SR_n$ are electrically connected in cascade. Each shift register $SR_1$-$SR_n$ includes an output terminal. The output terminals $G_{out1}$-$G_{outn}$ are respectively connected to the scan lines $S_1$-$S_n$ for providing the scan signal. Each shift register circuit $SR_1$-$SR_n$ receives two clock signals from the time controller 130. In at least one exemplary embodiment, the time controller 130 provides four clock signals CKV1-CKV4 to the first driving circuit 210. Each odd numbered shift register units $SR_1$, $SR_3$, . . . $SR_{(n-1)}$ receives the first clock signals CKV1 and CKV3, and each even numbered shift register $SR_2$, $SR_4$, . . . . $SR_n$ receives the clock signals CKV2 and CKV4.

The output signal of the (N−1)th shift register $SR_{(n-1)}$ is provided to the following stage shift register $SR_n$ as a reset signal, and receives output signal of the previous stage shift register $SR_{(n-2)}$, where n is an integer not less than 3. The first shift register $SR_1$ receives a start signal STV during each head of one frame time.

The shift registers $SR_1$-$SR_n$ have the same structure. Each shift register $SR_1$-$SR_n$ is formed as an 8T-1C type driving circuit as shown in FIG. 3, including a pull-up transistor M1, a pull-down transistor M2, a first transistor M3, a second transistor M4, a third transistor M5, a fourth transistor M6, a fifth transistor M7, a sixth transistor M8, a first node N1, a second node N2, and a first capacitor C1.

Figure 6:
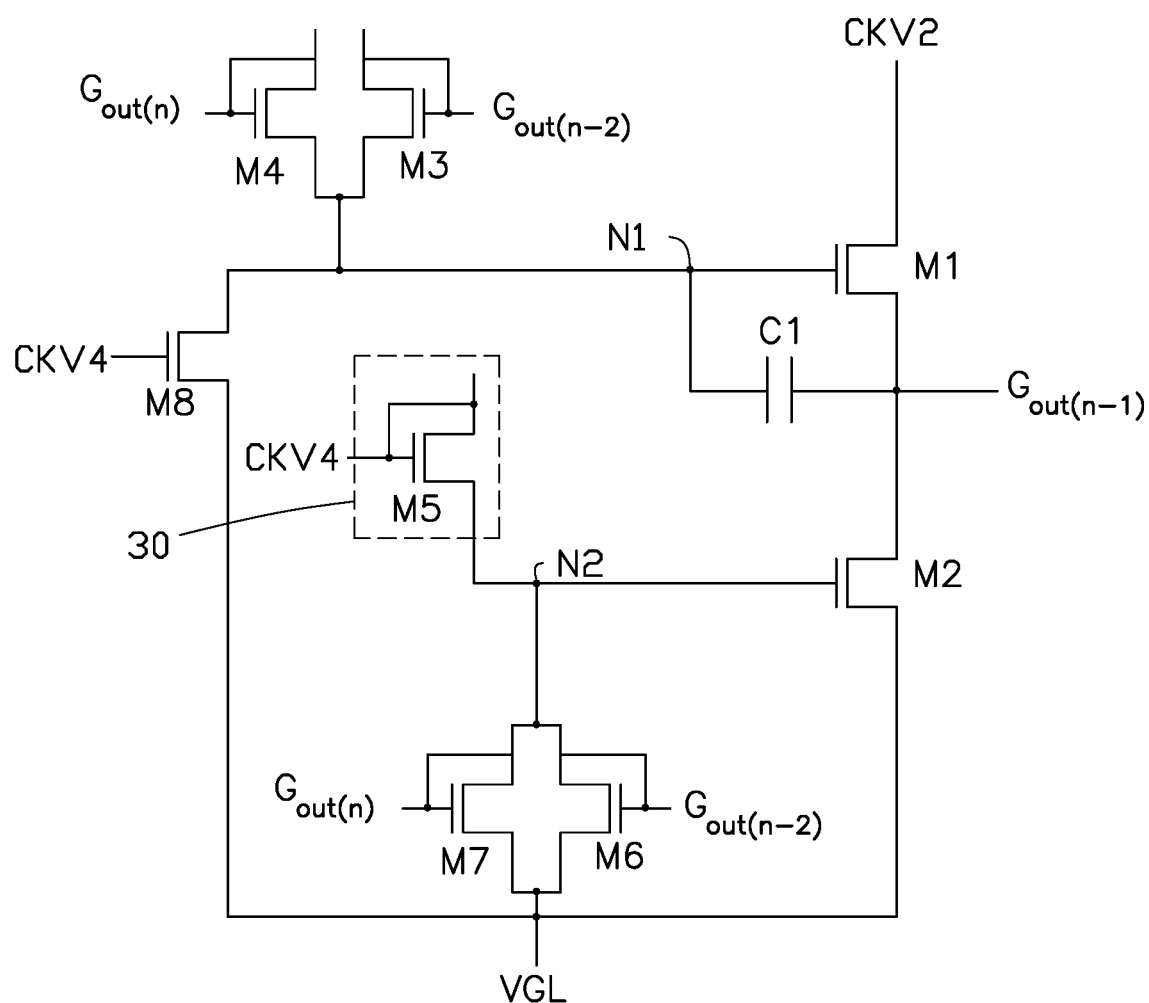
FIG. 6 is a circuit diagram of the (N−1)th shift register of the gate driving circuit of FIG. 5.

FIG. 6 illustrates the (N−1)th shift register $SR_{n-1}$. The second clock signal CKV2 is electrically connected to a source electrode of the pull-up transistor M1, and the fourth clock signal CKV4 is electrically connected to the gate electrode of the sixth transistor M8 and the gate electrode of the third transistor M5. A supply voltage VGL is applied to a source electrode of the pull-down transistor M2, to the drain electrodes of the fourth transistor M6, to the fifth transistor M7, and to the sixth transistor M8. The output terminal $G_{out(n-1)}$ is electrically connected between a drain electrode of the pull-up transistor M1 and a source electrode of the pull-down transistor M2. Drain electrodes of the first transistor M3 and the second transistor M4 are connected to each other and further connected to a gate electrode of the pull-up transistor M1 through the first node N1. The output terminal $G_{out(n-2)}$ is electrically connected to gate electrodes of the first transistor M3 and the fourth transistor M6. A source electrode of the first transistor M3 is electrically connected to the gate electrode of the first transistor M3. A source electrode of the second transistor is electrically connected to the gate electrode of the second transistor M4. The output terminal $G_{out(n)}$ is electrically connected to the gate electrodes of the second transistor M4 and the fifth transistor M7. Source electrodes of the fourth transistor M6 and the fifth transistor M7 are connected to the gate electrode of the pull-down transistor M2 through the second node N2. The first capacitor C1 is connected between the gate and source electrodes of the pull-up transistor M1. In at least one exemplary embodiment, the pull-up transistor M1, the pull-down transistor M2, the first transistor M3, the second transistor M4, the third transistor M5, the fourth transistor M6, the fifth transistor M7, and the sixth transistor M8 are N-type Metal Oxide Semiconductor (NMOS) transistors.

The first transistor M3 is used for controlling the pre-charging of the first capacitor C1 in the reverse scanning manner, and the second transistor M4 is used for controlling the pre-charging of the first capacitor C1 in the forward scanning manner.

The third transistor M5 forms the first pull-down module 30. The pull-down module 30 controls the pull-down transistor M2 to be turned on after the (N−1)th shift register $SR_{(n-1)}$ being reset, and prevents the output terminal $G_{out(n-1)}$ of the (N−1)th shift register $SR_{(n-1)}$ from outputting an error signal in the forward scanning manner.

The fourth transistor M6 controls the discharging of the first capacitor C1. The fifth transistor M7 resets Nth shift register $SR_n$ in the forward scanning manner.

Figure 7:
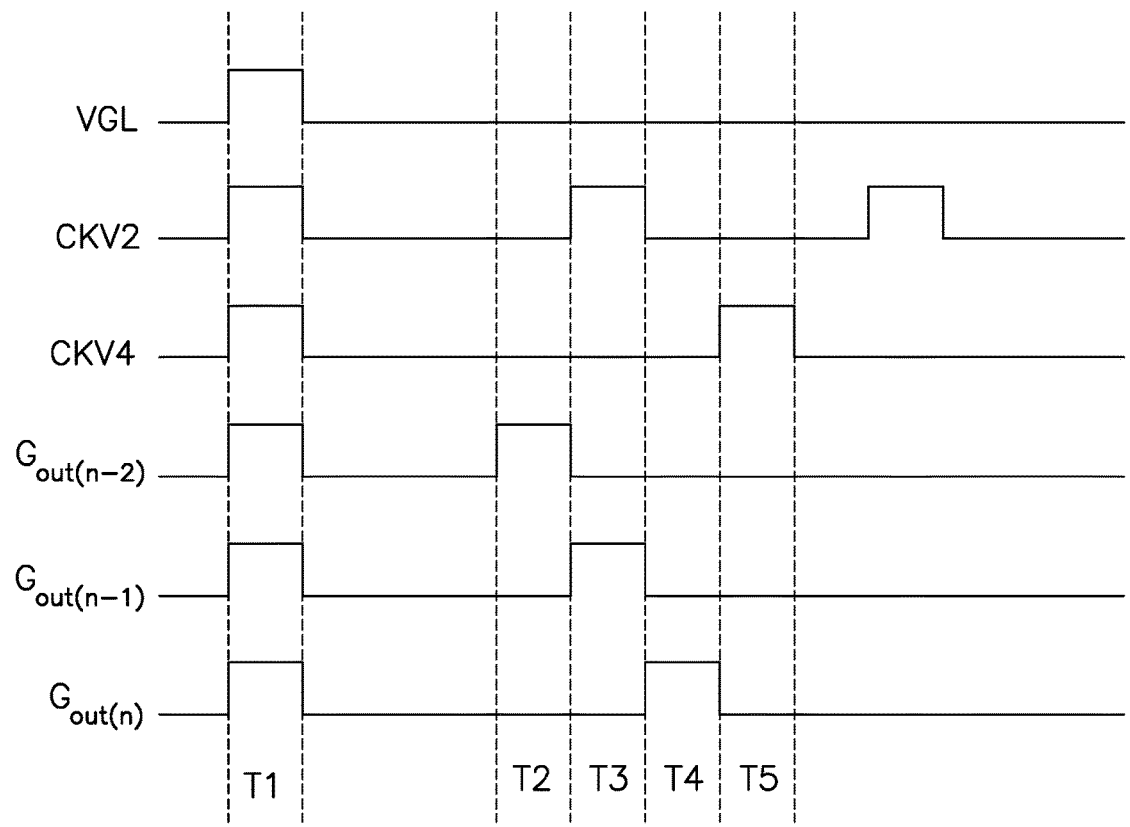
FIG. 7 a timing chart showing waveforms of various signals inputted to and outputted from the shift register of FIG. 6.

FIG. 7 illustrates operations of (N−1)th shift register $SR_{(n-1)}$ in a forward scanning manner during one frame time. In one frame time, the (N−1)th shift register $SR_{(n-1)}$ sequentially operates under a first period T1, a second period T2, a third period T3, and a fourth period T4. In operation of the (N−1)th shift register unit $SR_{(n-1)}$, the signal of the second clock signal CKV2 and the fourth clock signal CKV4 are simultaneously in a high level voltage during the first period, and phase-shifted in other periods. The first clock signal CKV1 and the third clock signal CKV3 are not shown in FIG. 7.

During a first period T1 (an initial period), the supply voltage VGL, the first clock signal CKV1, and the third clock signal CKV3 are in a high level voltage, the shift register $SR_{(n-1)}$ is in an initial state.

During a second period T2 (pre-charging period), the supply voltage VGL is in a low level voltage, the second clock signal CKV2 is in a low level voltage, and the fourth clock signal CKV4 is in a low level voltage. The (N−2)th driving signal from the (N−2)th output terminal $G_{out(n-2)}$ is in a high level voltage, and the Nth driving signal from the Nth output terminal $G_{out(n)}$ is in a low level voltage. The first transistor M3 turns on and the first capacitor C1 is charged. The pull-up transistor M1 turns on, and the output terminal $G_{out(n-1)}$ outputs a low level signal based on the second clock signal CKV2. The fourth transistor M6 turns on, thus the pull-down transistor M2 turns off. The second transistor M4, the third transistor M5, the fifth transistor M7, and the sixth transistor M8 turn off.

During a third period T3, the supply voltage VGL is in a low level voltage, the second clock signal CKV2 is in a high level voltage, and the fourth clock signal CKV4 is in a low level voltage. The signal outputted by the (N−2)th output terminal $G_{out(n-2)}$ is in a low level voltage, and the Nth driving signal from the Nth output terminal $G_{out(n)}$ is in a low level voltage. The pull-up transistor M1 turns on based on the potential stored by the first capacitor C1, and the output terminal $G_{out(n-1)}$ outputs a high level signal based on the second clock signal CKV2, thus the shift register $SR_{(n-1)}$ outputs the scan signal to the scan line $S_{(n-1)}$.

During a fourth period T4, the supply voltage VGL is in a low level voltage, the second clock signal CKV2 is in a low voltage level, and the fourth clock signal CKV4 is in a low level voltage. The signal outputted by the (N−2)th output terminal $G_{out(n-2)}$ is in a low level voltage, and the Nth driving signal from the Nth output terminal $G_{out(n)}$ is in a high level voltage. The second transistor M4 and the fifth transistor M7 turn on. The pull-up transistor M1 turns on, and the output terminal $G_{out(n-1)}$ outputs a low level signal based on the second clock signal CKV2.

During a fourth period T5 (reset period), the supply voltage VGL is in a low level voltage, the second clock signal CKV2 is in a low voltage level, and the fourth clock signal CKV4 is in a high level voltage. The signal outputted by the (N−2)th output terminal $G_{out(n-2)}$ is in a low level voltage, and the Nth driving signal from the Nth output terminal $G_{out(n)}$ is in a low level voltage. The third transistor M5 and the sixth transistor M8 turn on, and the pull-down transistor M2 turns on, thus the output terminal $G_{out(n-1)}$ of the (N−1)th shift register $SR_{(n-1)}$ is in a low level voltage for preventing the output terminal $G_{out(n-1)}$ from outputting an error signal.

The structure of the first driving circuit 110 allows the first driving circuit 110 to scan the scan lines $S_1$-$S_n$ in a forward manner, and to scan the scan lines $S_1$-$S_n$ in a reverse manner. The first driving circuit is driven by four clock signals during one frame time, thus the power consumption of the display driving circuit is reduced. The pull-down module prevents the shift register from outputting error signals after the reset period, thus a performance of the shift register is improved.

The exemplary embodiments shown and described above are only examples. Even though numerous characteristics and advantages of the present technology have been set forth in the foregoing description, together with details of the structure and function of the present disclosure, the disclosure is illustrative only, and changes may be made in the detail, including matters of shape, size, and arrangement of the parts within the principles of the present disclosure, up to and including the full extent established by the broad general meaning of the terms used in the claims.

What is claimed is:

1. A display driving circuit for driving pixel units, the display driving comprising:
    a time controller supplying four clock signals and data signals;
    a first driving circuit supplying scan signals to the pixel units; and
    a second driving circuit supplying the data signals to the pixel units;
    wherein the first driving circuit comprises a plurality of shift registers, and supplies the scan signals shifted in phase; the shift registers are connected in cascade; each shift register receives two of the four clock signals from the time controller; each shift register is electrically connected to at least one following stage shift register and is electrically connected to at least one previous stage shift register; each shift register is a bidirectional shift register and selectively operates in a forward scanning manner and a reverse scanning manner; during the forward scanning manner, the shift registers scans scan lines in an ascending order, during the reverse scanning manner, the shift registers scans the scan lines in a descending order; each shift register comprises a pull-up transistor, a pull-down transistor, and a pull-down module; the pull-down module controls the pull-down transistor to be turned on after the shift register is reset, and prevents the shift register outputting an error signal;
    wherein each shift register is electrically connected to a following stage shift register and a previous stage shift register; each shift register is formed as an 8T-1C type driving circuit comprising a first capacitor, a first transistor, a second transistor, a third transistor, a fourth transistor, a fifth transistor, and a sixth transistor; a first terminal of the first capacitor is electrically connected to a gate electrode of the pull-up transistor, and a second terminal of the first capacitor is electrically connected to a source electrode of the pull-up transistor; the first transistor controls a voltage provided to the first capacitor for pre-charging in the reverse scanning manner, and the second transistor controls a voltage provided to the first capacitor for pre-charging during in the forward scanning manner; the third transistor as the pull-down module pulls down a gate electrode of the pull-down transistor after being reset; the fourth transistor connected with the pull-down transistor is controlled by a signal from the previous stage shift register; the fifth transistor connected with the pull-down transistor is controlled by a signal from the following stage shift register; a source electrode of the fourth transistor is electrically connected to a gate electrode of the fourth transistor, and a source electrode of the fifth transistor is electrically connected to a gate electrode of the fifth transistor; the sixth transistor controls the pull-up transistor based on one of the received clock signals.

2. The display driving circuit of claim 1, wherein the odd numbered shift register receives a first clock signal and a third clock signal; and the even numbered shift register units receives a second clock signal and a fourth clock signal; signals of the first clock signal and the third clock signal are shifted.

3. The display driving circuit of claim 1, wherein the sixth transistor provides one of the received clock signals to the pull-up transistor, and a source electrode of the pull-up transistor receives the other of the received clock signals.

4. The display driving circuit of claim 1, wherein a gate electrode of the first transistor is electrically connected to the previous stage shift register, a gate electrode of the second transistor is electrically connected to the following stage shift register, drains of the first transistor and the second transistor are electrically connected to a gate of the pull-up transistor; a source electrode of the first transistor is electrically connected to the gate electrode of the first transistor, a source electrode of the second transistor is electrically connected to the gate electrode of the second transistor.

5. The display driving circuit of claim 3, wherein the third transistor controls the pull-down transistor to be turned on after the shift register is reset in the forward scanning manner and the reverse scanning manner; a gate electrode of the third transistor is electrically connected to the one of the received clock signals connected to the sixth transistor, a gate electrode of the fourth transistor is electrically connected to the previous stage shift register, a drain electrode of the third transistor is electrically connected to a gate electrode of the pull-down transistor; a source electrode of the third transistor is electrically connected to the gate electrode of the third transistor.

6. The display driving circuit of claim 3, wherein a gate electrode of the fourth transistor is electrically connected to the previous stage shift register, a gate electrode of the fifth transistor is electrically connected to the following stage shift register, drains electrodes of the fourth transistor and the fifth transistor are electrically connected to a supply voltage; source electrodes of the fourth transistor and the fifth transistor are electrically connected to a gate electrode of the pull-down transistor.

7. A shift register module with a plurality of shift registers connected in cascade, each shift register being connected with a following stage shift register and a previous stage shift register, each shift register comprising:

a pull-up transistor;
a pull-down transistor;
a pull-down module configured to prevent the shift register outputting an error signal; and
a first capacitor;
wherein the shift register is connected with a following stage shift register and a previous stage shift register, and two clock signals are applied to the shift register; the shift register is a bidirectional shift register; each shift register is formed as an 8T-1C type driving circuit comprising a first capacitor, a first transistor, a second transistor, a third transistor, a fourth transistor, a fifth transistor, and a sixth transistor; the third transistor controls the pull-down transistor to be turned on after the shift register is reset for preventing the shift register from outputting error signal both in the reverse scanning manner and the forward scanning manner; a gate electrode of the third transistor is electrically connected to one of the received clock signals, a gate electrode of the fourth transistor is electrically connected to the previous stage shift register, a drain electrode of the third transistor is electrically connected to a gate electrode of the pull-down transistor; a source electrode of the third transistor is electrically connected to the gate electrode of the third transistor; a source electrode of the fourth transistor is electrically connected to a gate electrode of the fourth transistor, and a source electrode of the fifth transistor is electrically connected to a gate electrode of the fifth transistor; the sixth transistor controls the pull-up transistor based on one of the received clock signals.

8. The shift register module of claim 7, wherein the first transistor controls a voltage provided to the first capacitor for pre-charging in the reverse scanning manner, and the second transistor controls a voltage provided to the first capacitor for pre-charging during in the forward scanning manner; a gate electrode of the first transistor is electrically connected to the previous stage shift register, a gate electrode of the second transistor is electrically connected to the following stage shift register, drains of the first transistor and the second transistor are electrically connected to a gate of the pull-up transistor; a source electrode of the first transistor is electrically connected to the gate electrode of the first transistor, a source electrode of the second transistor is electrically connected to the gate electrode of the second transistor.

9. The shift register module of claim 8, wherein a gate electrode of the fourth transistor is electrically connected to the previous stage shift register, a gate electrode of the fifth transistor is electrically connected to the following stage shift register, drain electrodes of the fourth transistor and the fifth transistor are electrically connected to a supply voltage; source electrodes of the fourth transistor and the fifth transistor are electrically connected to a gate electrode of the pull-down transistor.

10. The shift register module of claim 8, wherein a supply voltage is applied to drain electrodes of the pull-down transistor, the fifth transistor, and the sixth transistor.

* * * * *